(12) United States Patent
Nakanishi (10) Patent No.: US 12,262,594 B2
(45) Date of Patent: Mar. 25, 2025

(54) DISPLAY DEVICE AND METHOD FOR MANUFACTURING DISPLAY DEVICE

(71) Applicant: SHARP KABUSHIKI KAISHA, Sakai (JP)

(72) Inventor: Yohei Nakanishi, Sakai (JP)

(73) Assignee: SHARP KABUSHIKI KAISHA, Osaka (JP)

(*) Notice: Subject to any disclaimer, the term of this patent is extended or adjusted under 35 U.S.C. 154(b) by 418 days.

(21) Appl. No.: 17/802,763

(22) PCT Filed: Mar. 4, 2020

(86) PCT No.: PCT/JP2020/009228
§ 371 (c)(1),
(2) Date: Aug. 26, 2022

(87) PCT Pub. No.: WO2021/176610
PCT Pub. Date: Sep. 10, 2021

(65) Prior Publication Data
US 2023/0081200 A1 Mar. 16, 2023

(51) Int. Cl.
*H10K 59/123* (2023.01)
*H10K 71/00* (2023.01)
*H10K 59/12* (2023.01)

(52) U.S. Cl.
CPC .......... *H10K 59/123* (2023.02); *H10K 71/00* (2023.02); *H10K 59/1201* (2023.02)

(58) Field of Classification Search
CPC .............................. H10K 59/123; H10K 71/00
See application file for complete search history.

(56) References Cited

U.S. PATENT DOCUMENTS 11,527,740 B2 * 12/2022 Kim ..................... H10K 50/858
2021/0104590 A1 * 4/2021 Kim ..................... H10K 59/1213

FOREIGN PATENT DOCUMENTS

JP 2019-079619 A 5/2019

* cited by examiner

*Primary Examiner* — Douglas M Menz
(74) *Attorney, Agent, or Firm* — ScienBiziP, P.C.

(57) ABSTRACT

In a display device including a light-emitting element layer formed on a thin film transistor layer, the light-emitting element layer includes pixel electrodes, a cover film, a light-emitting layer, and a common electrode. The pixel electrodes each include a flat first portion overlapping with the light-emitting layer and a second portion surrounding the first portion. The first portion protrudes toward the light-emitting layer compared to the second portion. The cover film covers the second portion and causes the first portion to expose. An upper face of the first portion and an upper face of the cover film form a flush planar face.

20 Claims, 10 Drawing Sheets

DISPLAY DEVICE AND METHOD FOR MANUFACTURING DISPLAY DEVICE

TECHNICAL FIELD

The disclosure relates to a display device and a method for manufacturing the display device.

BACKGROUND ART

PTL 1 discloses a technique, in a display device including a light-emitting element, forming a frame-shaped bank using a cover film overlapping with an edge portion of a pixel electrode, and then forming a light-emitting layer overlapping with an opening of the bank by a coating method.

CITATION LIST

Patent Literature

PTL 1: JP 2019-79619 A

SUMMARY

Technical Problem

In the technique disclosed in PTL 1, a phenomenon occurs in which, solutes gather near an end of the bank after the coating of the light-emitting layer and solvent volatilization. This leads to a problem in that, in a plan view, the brightness at the center of the opening of the cover film becomes lower than that at the edge of the opening of the cover film.

Solution to Problem

A display device according to an aspect of the disclosure is provided with a display region including a plurality of pixels, the display device includes: a base material; a thin film transistor layer including a thin film transistor; and a light-emitting element layer including a plurality of light-emitting elements with different luminescent colors and formed on an upper layer overlying the thin film transistor, in which the light-emitting element layer includes a pixel electrode provided for each of the plurality of light-emitting elements, a cover film, a common electrode common to the plurality of light-emitting elements, and a light-emitting layer provided between the pixel electrode and the common electrode, one of the pixel electrode and the common electrode is an anode electrode, and a remaining one of the pixel electrode and the common electrode is a cathode electrode, the pixel electrode includes a flat first portion overlapping with the light-emitting layer and a second portion surrounding the first portion, the first portion protrudes toward the light-emitting layer compared to the second portion, the cover film covers the second portion and exposes the first portion, and an upper face of the first portion and an upper face of the cover film form a flush planar face.

Advantageous Effects of Disclosure

An aspect of the disclosure makes it possible to improve the problem in that the brightness at the center of the opening of the cover film becomes lower than that at the edge of the opening of the cover film in a plan view.

DESCRIPTION OF EMBODIMENTS

First Embodiment

Figure 1:
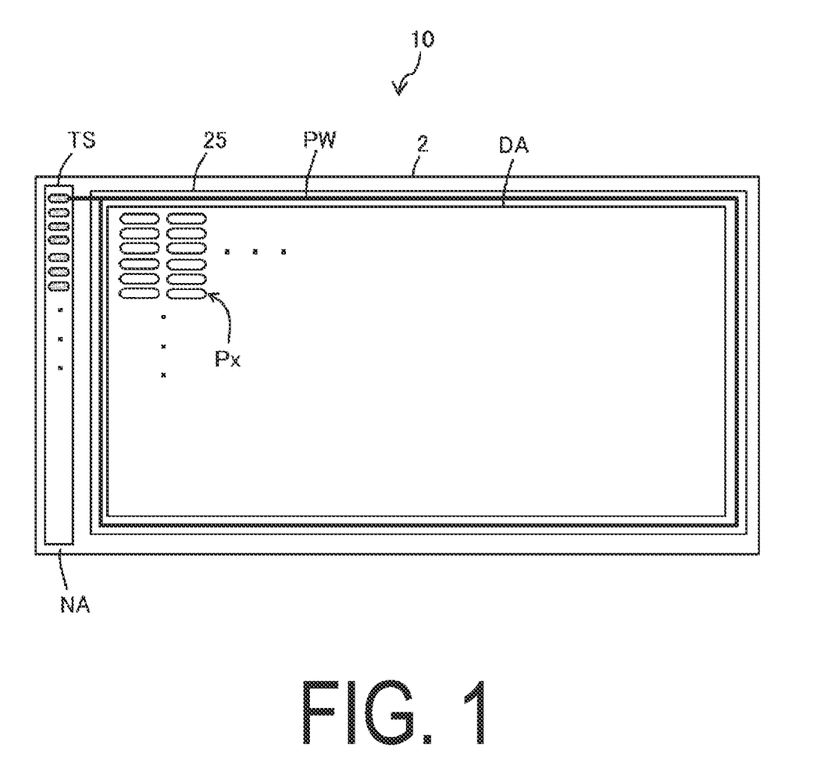
FIG. 1 is a plan view illustrating a configuration of a display device according to a first embodiment.
Figure 2:
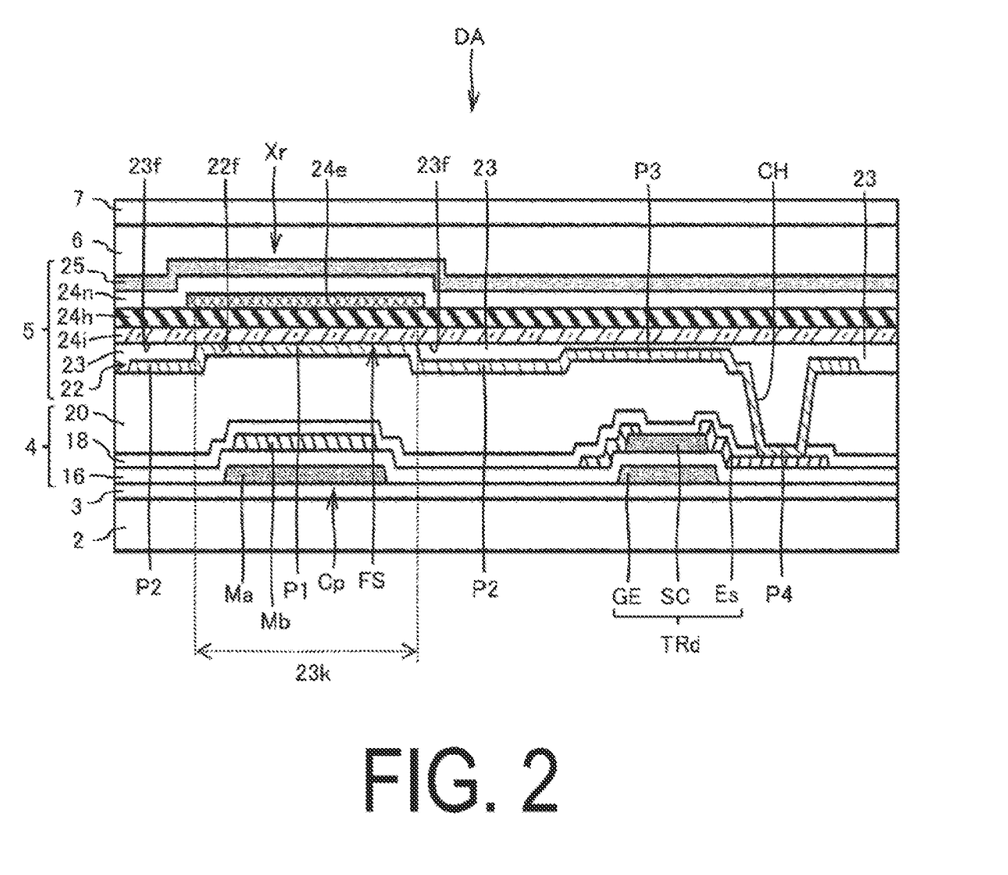
FIG. 2 is a cross-sectional view illustrating a configuration of a display region according to the first embodiment.
Figure 3:
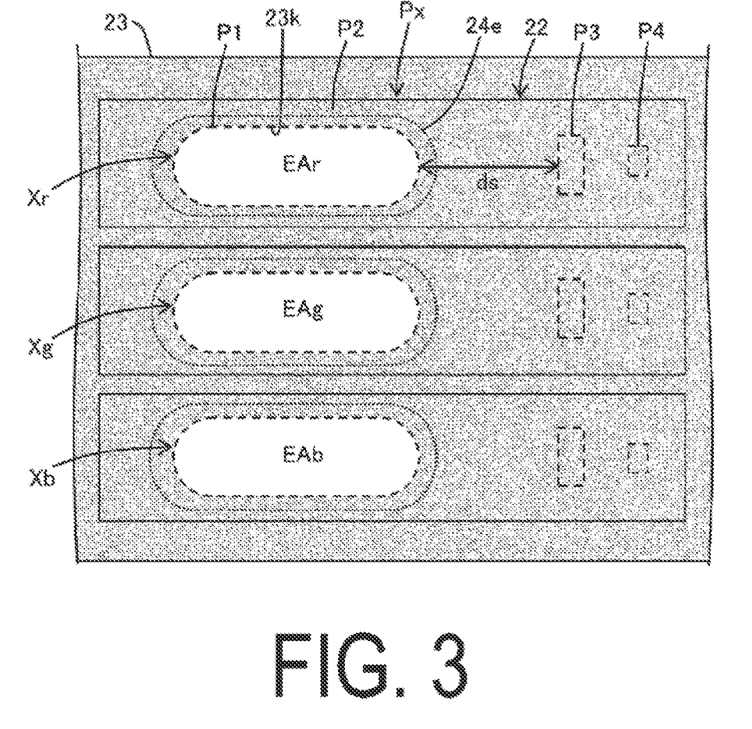
FIG. 3 is a plan view illustrating a configuration of the display region according to the first embodiment.

FIG. 1 is a plan view illustrating a configuration of a display device according to a first embodiment. FIG. 2 is a cross-sectional view illustrating a configuration of a display region according to the first embodiment. FIG. 3 is a plan view illustrating a configuration of the display region according to the first embodiment. As illustrated in FIGS. 1 and 2, in a display device 10, a barrier layer 3, a thin film transistor layer 4, a light-emitting element layer 5 of a top emission (emitting light to an upper-layer side) type, and a sealing layer 6 are formed in this order on a base material 2, and a plurality of pixels Px are provided in a display region DA. A frame region NA surrounding the display region DA is provided with a terminal portion TS, various drivers, and the like.

The base material 2 is a glass substrate or a flexible base material including a resin such as polyimide as a main component, and for example, the base material 2 may be formed of two polyimide films and an inorganic film sandwiched therebetween. The barrier layer (under coat layer) 3 is an inorganic insulating layer that prevents penetration of foreign substances such as water or oxygen, and can be formed using, for example, silicon nitride, silicon oxide, or the like.

The thin film transistor layer 4 includes: a first metal layer Ma and a gate electrode GE which are upper layers overlying the barrier layer 3; a gate insulating film 16 which is an upper layer overlying the first metal layer Ma and the gate electrode GE; a semiconductor film SC which is an upper layer overlying the gate insulating film 16; a second metal layer Mb and a conduction electrode Es which are upper layers overlying the semiconductor film SC; an inorganic insulating film 18 which is an upper layer overlying the second metal layer Mb and the conduction electrode Es; and an interlayer insulating film 20 which is an upper layer overlying the inorganic insulating film 18.

The semiconductor film SC is, for example, an oxide semiconductor or low-temperature polysilicon. A transistor TRd, which is a thin film transistor (TFT), is formed so as to include the gate electrode GE and the semiconductor film SC. The conduction electrode Es functions as a source electrode or a drain electrode for the transistor TRd. Instead of the one described above, the thin film transistor layer 4 may have, for example, a configuration (LTPO configuration) including: a semiconductor film including an oxide semiconductor; and a semiconductor film including low-temperature polysilicon. The first metal layer Ma and the second metal layer Mb face each other with the inorganic insulating film 18 interposed therebetween, and form a capacitance forming portion Cp.

The gate insulating film 16 and the inorganic insulating film 18 may be formed by a silicon oxide (SiOx) film or a silicon nitride (SiNx) film, or a layered film thereof, formed using CVD, for example. The interlayer insulating film 20 can be formed of, for example, a coatable organic material such as polyimide or acrylic resin.

The gate electrode GE, the first metal layer Ma, the second metal layer Mb, and the conduction electrode Es are each formed of a metal single layer film or a layered film including at least one of aluminum, tungsten, molybdenum, tantalum, chromium, titanium, and copper, for example.

The light-emitting element layer 5 includes: a pixel electrode (anode electrode) 22 which is an upper layer overlying the interlayer insulating film 20; a cover film 23 having insulating properties and covering at least an edge of the pixel electrode; a hole injection layer 24$i$ (charge function layer) which is an upper layer overlying the cover film 23; a hole transport layer 24$h$ which is an upper layer overlying the hole injection layer 24$i$; a light-emitting layer 24$e$ which is an upper layer overlying the hole transport layer 24$h$; an electron transport layer 24$n$ which is an upper layer overlying the light-emitting layer 24$e$; and a common electrode (cathode electrode) 25 which is an upper layer overlying the electron transport layer 24$n$. The hole injection layer 24$i$, the hole transport layer 24$h$, the light-emitting layer 24$e$, and the electron transport layer 24$n$ are formed of a coatable material.

Examples that may be employed as the material of the hole injection layer 24$i$ and the hole transport layer 24$h$ include: benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, and derivatives thereof; linear conjugated organic monomers, oligomers, or polymers of a polysilane-based compound, a vinylcarbazole-based compound, a thiophene-based compound, an aniline-based compound, or the like, and inorganic materials such as nickel oxide and tungsten oxide a solution of which can be used for forming a film.

Examples of the material of the light-emitting layer 24$e$ include: anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and derivatives thereof; tris(8-quinolinolato)aluminum complex; bis(benzoquinolinolato) beryllium complex; tri (dibenzoylmethyl) phenanthroline europium complex; other organic light-emitting materials such as ditoluylvinylbiphenyl; and quantum dot materials including C, Si, Ge, Sn, P, Se, Te, Cd, Zn, Mg, S, In, or O.

Examples of the material of the electron transport layer 24$n$ include inorganic nanoparticles such as zinc oxide (ZnO) and magnesium-doped zinc oxide (MgZnO). Note that, at the time of coating, a solvent corresponding to the material (solute) of each layer is used and applied as a solution.

The concentrations of the liquid materials in the respective solutions for the hole injection layer 24$i$, the hole transport layer 24$h$, and the light-emitting layer 24$e$ are preferably 10 wt. % or less, more preferably 6 wt. % or less, and even more preferably 4 wt. % or less. When the concentrations of the liquid materials is within the ranges described above, droplets dropped or coated by a method such as an inkjet method or a coating method quickly dry, so that the layers can be quickly formed.

As illustrated in FIGS. 2 and 3, a plurality of light-emitting elements Xr, Xg, and Xb emitting light of different colors (red, green, and blue for example) are formed in the light-emitting element layer 5. For each of the light-emitting elements, the pixel electrode 22 having an island shape and the light-emitting layer 24$e$ located between the pixel electrode 22 and the common electrode 25 are formed. The light-emitting layer 24$e$ is formed in an island shape so as to overlap with an opening 23$k$ of the cover film 23, using a coating or photolithographic method, for example.

The light-emitting elements Xr, Xg, and Xb may each be, for example, a quantum dot light-emitting diode (QLED) with the light-emitting layer 24$e$ being a quantum dot light-emitting layer, or may be an organic light-emitting diode (OLED) with the light-emitting layer 24$e$ being an organic light-emitting layer.

The pixel electrode 22 is a light reflective electrode formed by layering Indium Tin Oxide (ITO) and silver (Ag) or an alloy containing Ag, for example. The cover film 23 is formed by coating an organic material such as polyimide or an acrylic resin and then patterning the organic material by photolithography, for example. The common electrode 25 is formed of a metal thin film of a magnesium silver alloy or the like, and has optical transparency. When metal oxide nanoparticles such as ZnO are used for the electron transport layer 24$n$, and Ag nanowires are used for the common electrode 25, the common electrode 25 and the electron transport layer 24$n$ can be formed by coating.

As illustrated in FIG. 1, the common electrode 25 is drawn from the terminal portion TS, and is connected to an ELVSS wiring line PW formed to surround the display region DA.

In a case where the light-emitting elements Xr, Xg, and Xb are each a QLED, positive holes and electrons recombine in the light-emitting layer 24$e$ in response to a drive current between the pixel electrode 22 and the common electrode 25, and light is emitted when excitons generated in this manner transition from a conduction band of quantum dots to a valence band. In a case where the light-emitting elements Xr, Xg, and Xb are each an OLED, positive holes and electrons recombine in the light-emitting layer 24$e$ in response to a drive current between the pixel electrode 22 and the common electrode 25, and light is emitted when excitons generated in this manner transition to a ground state.

The sealing layer 6 covering the light-emitting element layer 5 is a layer that prevents penetration of foreign substances such as water or oxygen into the light-emitting element layer 5, and for example, the sealing layer 6 can include two inorganic sealing films and an organic film formed therebetween.

A functional film 7 provided on the sealing layer 6 has at least one of a touch sensor function, an optical compensation function, and a surface protection function, for example.

In a case where the light-emitting layer 24$e$ is a quantum dot light-emitting layer, unlike the case where the light-emitting layer 24$e$ is an organic light-emitting layer, the sealing layer 6 that prevents penetration of foreign substances such as water or oxygen into the light-emitting element layer 5, for example, may be formed using methods, such as forming a resin film by coating, attaching a film, and sealing with a glass substrate, rather than forming an inorganic film like SiO₂ by sputtering.

Figure 4:
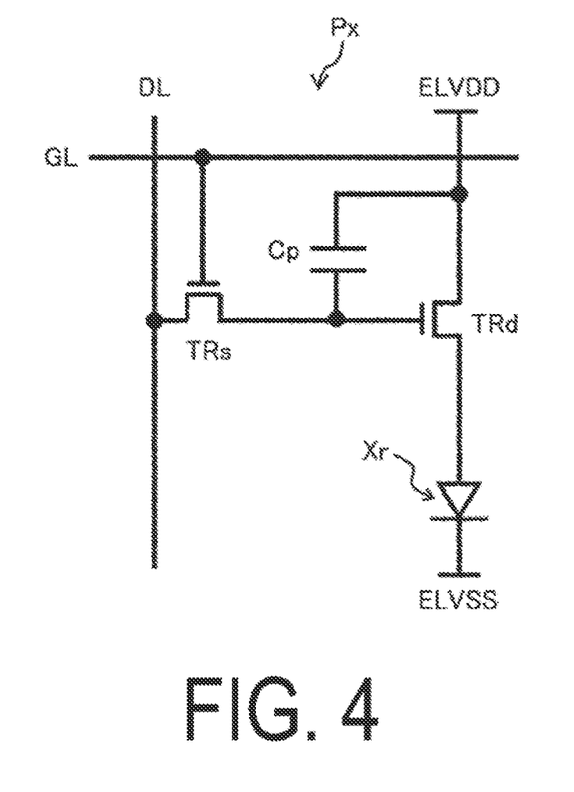
FIG. 4 is a circuit diagram illustrating a configuration example of a pixel according to the first embodiment.

FIG. 4 is a circuit diagram illustrating a configuration example of a pixel according to the first embodiment. The pixel Px includes a transistor TRs (selecting transistor), the transistor TRd (drive transistor), the capacitance forming portion Cp, and a light-emitting element Xr. The gate electrode of the selecting transistor TRs is connected to a scanning signal line GL. The gate electrode of the transistor TRd is connected to an ELVDD power source (high potential-side power source) via the capacitance forming portion Cp, and is connected to a data signal line DL via the transistor TRs. The anode electrode (pixel electrode 22) of the light-emitting element Xr is connected to the ELVDD power source via the transistor TRd. The cathode electrode (common electrode 25) of the light-emitting element Xr is connected to an ELVSS power source (low potential-side power source).

Note that the scanning signal line GL is formed in the same layer as the first metal layer Ma in FIG. 2, and the data signal line DL is formed in the same layer as the second metal layer Mb in FIG. 2. In FIG. 2, the first metal layer Ma is connected to the gate electrode GE of the transistor TRd, and the second metal layer Mb is connected to the high potential-side power source (ELVDD power source).

In the present embodiment, as illustrated in FIGS. 2 and 3, the pixel electrode 22 includes a flat first portion P1 that overlaps the light-emitting layer 24*e* and a second portion P2 surrounding the first portion P1. The first portion P1 overlapping the capacitance forming portion Cp protrudes toward the light-emitting layer 24*e* from the second portion P2. The cover film 23 covers the second portion P2 and expose the first portion P1 through the opening 23*k*. An upper face 22*f* of the first portion P12 and an upper face 23*f* of the cover film 23 form a flush planar face FS. On the planar face FS, the hole injection layer 24*i* is formed as a charge function layer common to the plurality of light-emitting elements Xr, Xg, and Xb. Note that the term "flush" means that a plurality of planar faces are connected to each other without unevenness.

The pixel electrode 22 further includes a third portion P3, on the outer side of the second portion P2 in a plan view, protruding toward the light-emitting layer 24*e* side by overlapping at least the semiconductor film SC of the transistor TRd. The third portion P3 is covered by the cover film 23. Here, in the pixel electrode 22, a distance ds between the first portion P1 and the third portion P3 is set to be 5 [μm] or more. The third portion P3 overlaps with at least one of the semiconductor film, electrode, and wiring line included in the thin film transistor layer 4, to protrude toward the light-emitting layer.

The pixel electrode 22 further includes a fourth portion P4, on the outer side of the second portion P2 in a plan view, being in contact with the conduction electrode Es of the transistor TRd through a contact hole CH formed in the interlayer insulating film 20. The contact hole CH is filled with the cover film 23 (organic resin).

In FIG. 2, since the capacitance forming portion Cp includes the first metal layer Ma and the second metal layer Mb (each electrode has a thickness of approximately 100 to 500 nm), even when being leveled with the interlayer insulating film 20 having a thickness of approximately 2000 nm, the capacitance forming portion Cp rises by approximately 100 to 600 nm from the periphery. This means that the pixel electrode 22 formed on the interlayer insulating film 20 also has a shape with unevenness. Thus, the cover film 23 is disposed in the recess portion (second portion P2) of the pixel electrode, whereby the upper face 22*f* of the first portion P1 and the upper face 23*f* of the cover film 23 are flush to form the planar face FS.

According to the first embodiment, by using the coating method, the hole injection layer 24*i*, the hole transport layer 24*h*, the light-emitting layer 24*e*, and the electron transport layer 24*n* can be formed, without unevenness in the film thickness, on the planar face FS, so as to overlap with the entire first portion P1 of the pixel electrode 22 and with the second portion P2. This can solve the problem in that, in each of the hole injection layer 24*i*, the hole transport layer 24*h*, the light-emitting layer 24*e*, and the electron transport layer 24*n*, when each solution is applied, the unevenness of the coating surface causes unevenness of the respective solutions (meniscus), which causes the solute to segregate after drying. Thus, in FIG. 3, uniform brightness is achieved in light-emitting regions (EAr, EAb, and EAg) overlapping the opening 23*k* of the cover film 23, and the first portion P1, whereby desired light emission efficiency can be achieved.

Beneath the pixel electrode 22, the transistor TRd is provided and furthermore, the contact hole CH (with a depth of 2500 nm for example) is formed through the interlayer insulating film 20 (a resin film providing a leveling effect) to establish connection between the pixel electrode 22 and the transistor TRd. The unevenness caused thereby affects the film formation of the hole injection layer 24*i*, the hole transport layer 24*h*, and the light-emitting layer 24*e*, and may cause uneven distribution of the solutes at the time of coating. For example, the third portion P3 which is a portion of the pixel electrode 22 and protruding due to the transistor TRd is covered with the cover film 23 to be a region uninvolved in the light emission. Furthermore, the contact hole CH is filled with the cover film 23 (organic resin) to make the fourth portion P4 a region uninvolved in the light emission.

When the protrusion due to the transistor TRd and the recess due to the contact hole CH are large, an upper region of the third portion P3 or an upper region of the fourth portion P4 of the pixel electrode 22 may be not easily leveled. In this case, the cover film 23 on the third portion P3 may be formed to be thinner than the periphery using a halftone mask or the like. If this cannot achieve the leveling, only the regions above the first portion P1 and the second portion P2 are leveled. In this case, the first portion P1 is preferably separated from the third portion P3 and the fourth portion P4 by 5 μm or more, to prevent the unevenness in film thickness due to unevenness on the coating surface from affecting the light-emitting regions (EAr, EAg, and EAb) overlapping the first portion P1.

Figure 10:
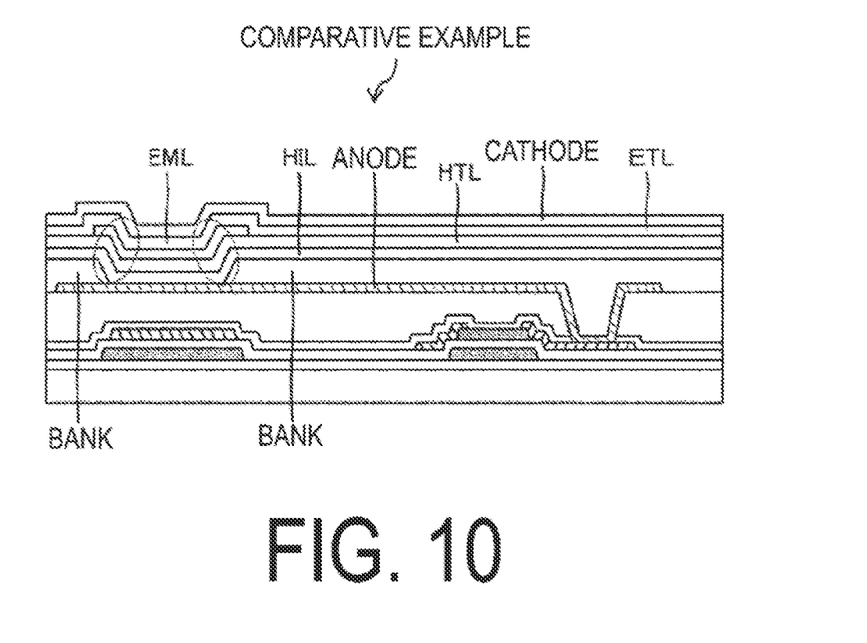
FIG. 10 is a cross-sectional view illustrating a configuration of a display device according to Comparative Example.

In Comparative Example illustrated in FIG. 10, an edge of an anode (pixel electrode) is covered by a bank of the organic resin, and an hole injection layer HIL, a hole transport layer HTL, and a light-emitting layer EML are formed over the bank to overlap with an opening of the organic resin. This configuration has a problem in that the solutes gather around the bank edge (portions surrounded by dashed lines) after the coating of the layers (HIL, HTL, and EML) and the solvent volatilization, which causes ring shaped light emission with high brightness at the edge of the opening of the organic resin and low brightness at the center of the opening in a plan view.

For the cover film 23, not only the organic resin as described above, but an inorganic insulating film such as silicon oxide, silicon nitride, or the like may be used. Even in this case, the organic resin is used because a large film thickness is required to fill the contact hole CH.

Figure 5:
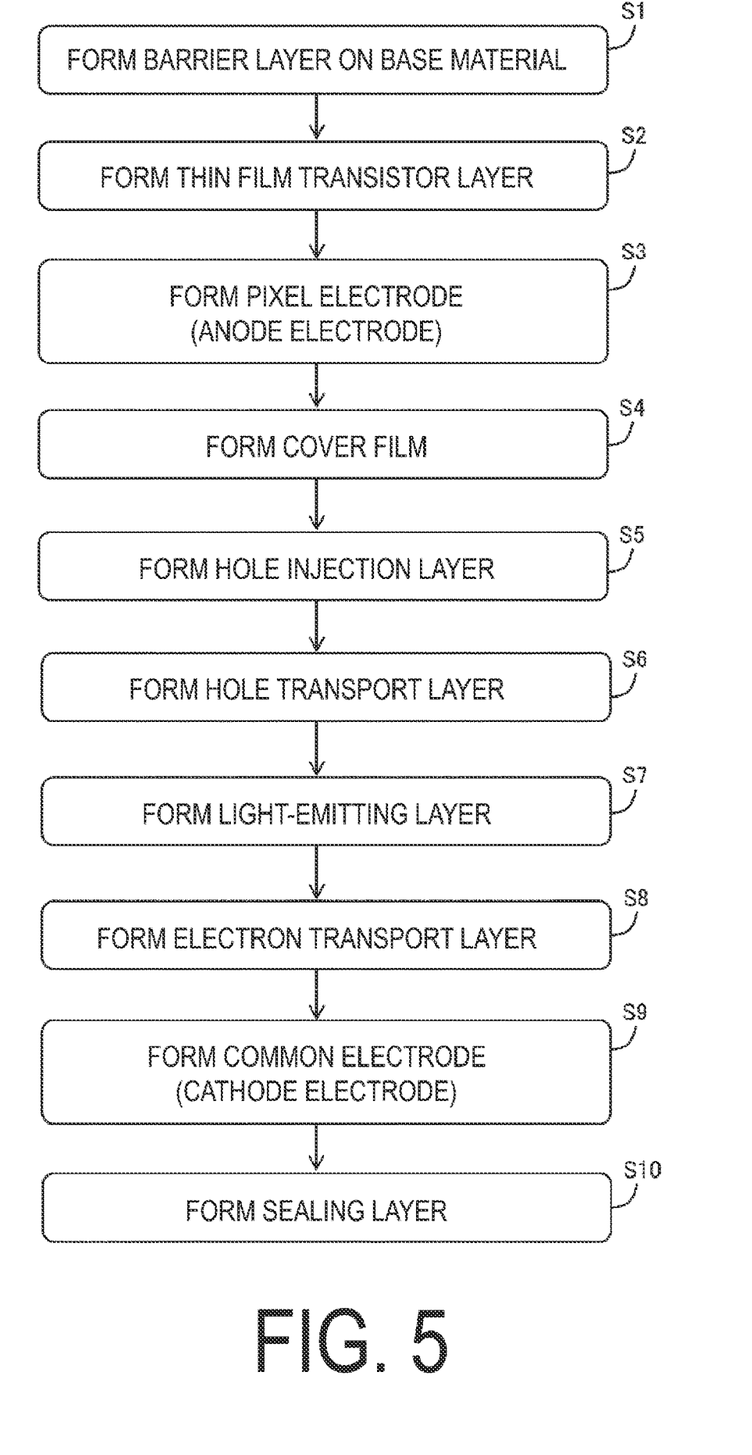
FIG. 5 is a flowchart illustrating a method for manufacturing the display device according to the first embodiment.
Figure 6:
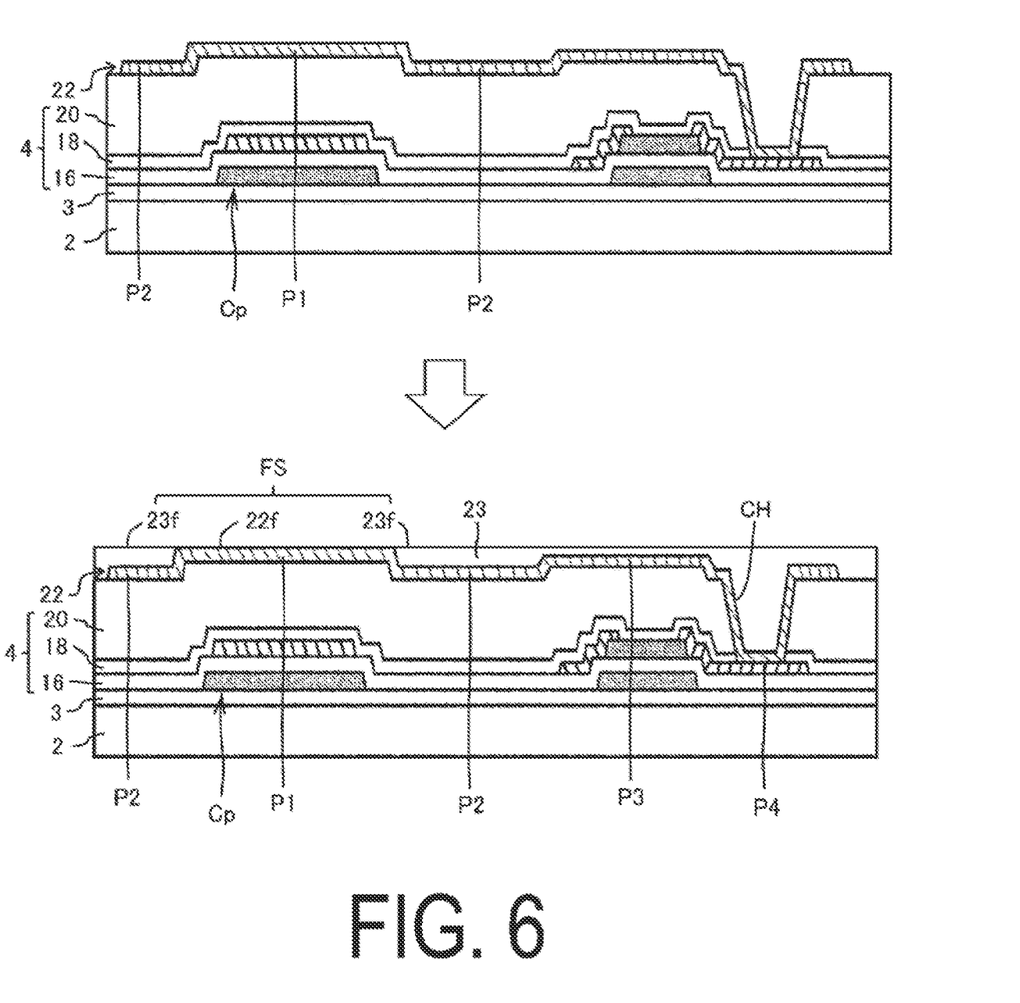
FIG. 6 is a cross-sectional view illustrating the method for manufacturing the display device according to the first embodiment.
Figure 7:
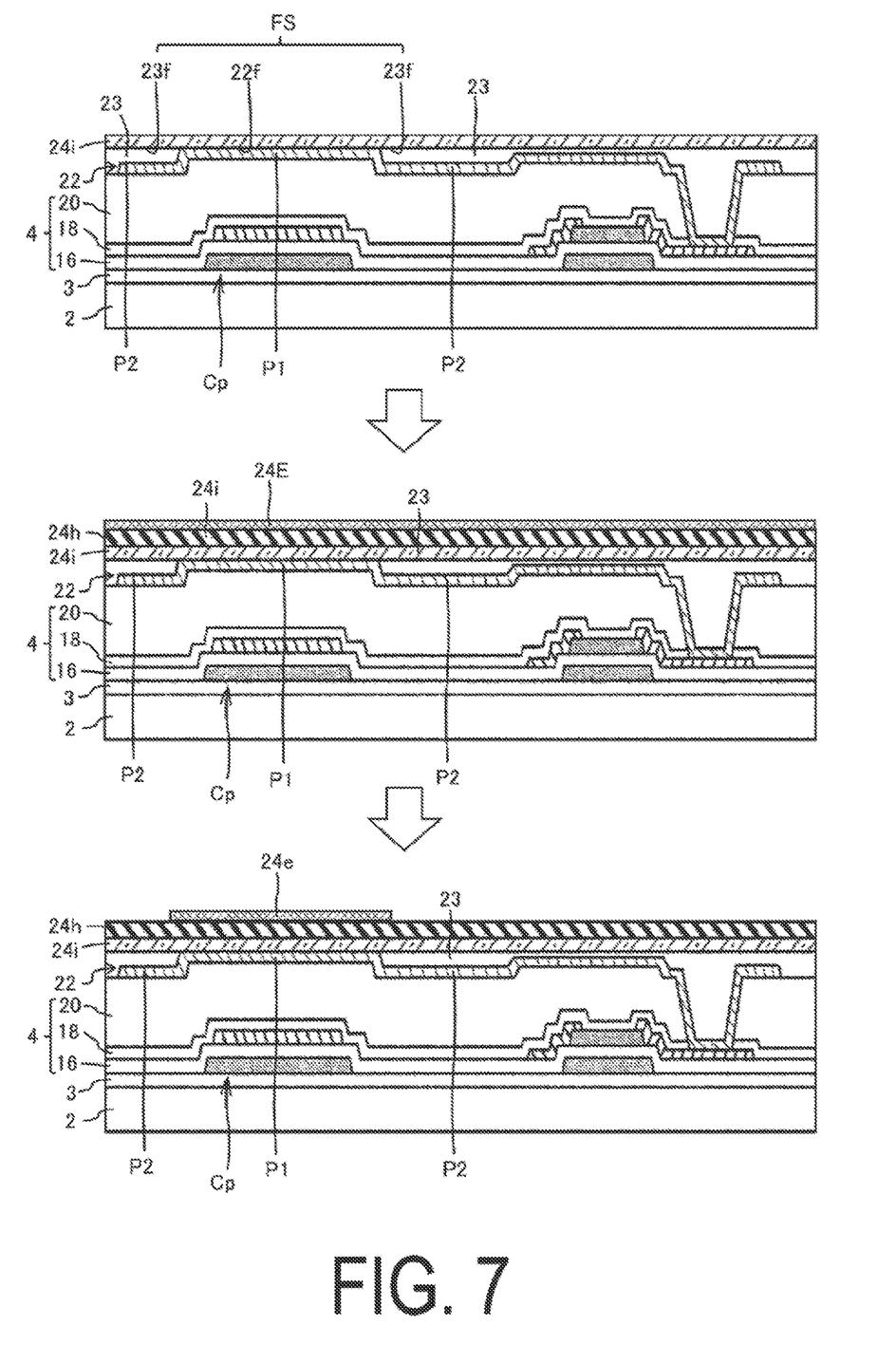
FIG. 7 is a cross-sectional view illustrating the method for manufacturing the display device according to the first embodiment.

FIG. 5 is a flowchart illustrating a method for manufacturing the display device according to the first embodiment. FIG. 6 is a cross-sectional view illustrating the method for manufacturing the display device according to the first embodiment. FIG. 7 is a cross-sectional view illustrating the method for manufacturing the display device according to the first embodiment. In the first embodiment, as illustrated in FIG. 5 to FIG. 7, the barrier layer 3 is formed on the base material 2 in step S1. In step S2, the thin film transistor layer 4 is formed on the barrier layer 3.

In step S3, the pixel electrode (anode electrode) 22 is formed on the interlayer insulating film 20 of the thin film transistor layer 4. Here, as illustrated in FIG. 6, the pixel electrode 22 is formed so as to include the flat first portion P1 and the second portion P2 surrounding the first portion P1, the first portion P1 protruding upward from the second portion P2. Specifically, the first portion P1 of the pixel electrode 22 is disposed at a position overlapping with the capacitance forming portion Cp so as to be raised from the surrounding second portion P2.

An example of a specific configuration of the pixel electrode 22 includes a configuration in which silver (Ag) is provided between two transparent conductive films (such as ITO and IZO). The pixel electrode 22 is formed by sputtering for example.

In step S4, the cover film 23 is formed on the pixel electrode 22. Here, as illustrated in FIG. 6, the cover film 23 is formed to cover the second portion P2, the third portion P3, and the fourth portion P4 of the pixel electrode 22 so as to expose the first portion P1. Here, the second portion P2 (recess portion) surrounding the first portion P1 (protrusion portion) is filled with the cover film (organic resin) 23 providing the leveling effect, so that the planar face FS is formed with the upper face 22f of the first portion P12 and the upper face 23f of the cover film 23 connected to each other while being flush. The thickness of the cover film 23 on the second portion P2 is, for example, from 100 to 1500 nm, and preferably from 200 to 600 nm.

As illustrated in FIG. 7, in step S5, the hole injection layer 24i serving as a charge function layer common to a plurality of light-emitting elements is formed on the planar face FS by coating. In step S6, the hole transport layer 24 h common to the plurality of light-emitting elements is formed on the flat hole injection layer 24i by coating.

In step S7, as illustrated in FIG. 7, a solution 24E for the light-emitting layer is applied on the flat hole transport layer 24 h by a spin coating method, for example. Then, patterning is performed using a photolithographic method. Here, patterning is performed to make the light-emitting layer 24e overlap with the entire first portion P1 of the pixel electrode 22 and with the second portion P2.

As illustrated in FIG. 2, in step S8, the electron transport layer 24n is formed to cover the light-emitting layer 24e. In step S9, the common electrode 25 (cathode electrode) is formed to cover the electron transport layer 24n. In step S109, the sealing layer 6 is formed to cover the common electrode 25.

Second Embodiment

Figure 8:
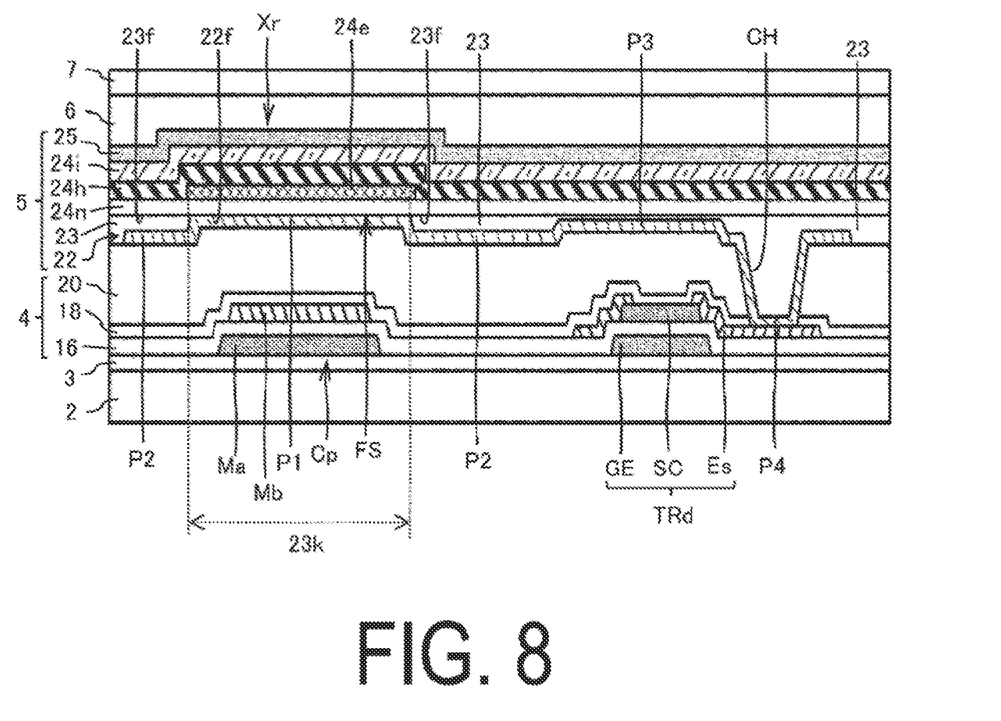
FIG. 8 is a cross-sectional view illustrating a configuration of a display region according to a second embodiment.

FIG. 8 is a cross-sectional view illustrating a configuration of a display region according to a second embodiment. The light-emitting element layer 5 of the second embodiment includes the pixel electrode 22 (cathode electrode) which is an upper layer overlying the interlayer insulating film 20; the cover film 23 having an insulating properties and covering at least the edge of the pixel electrode; the electron transport layer 24n which is an upper layer overlying the cover film 23; the light-emitting layer 24e which is an upper layer overlying the electron transport layer 24n; the hole transport layer 24 h which is an upper layer overlying the light-emitting layer 24e; the hole injection layer 24i which is an upper layer overlying the hole transport layer 24h; and the common electrode 25 (anode electrode) which is an upper layer overlying the hole injection layer 24i.

In FIG. 8, the upper face 22f of the first portion P1 and the upper face 23f of the cover film 23 are flush to form the planar face FS. On the planar face FS, the electron transport layer 24n is formed as a charge function layer common to a plurality of light-emitting elements Xr, Xg, and Xb.

Figure 9:
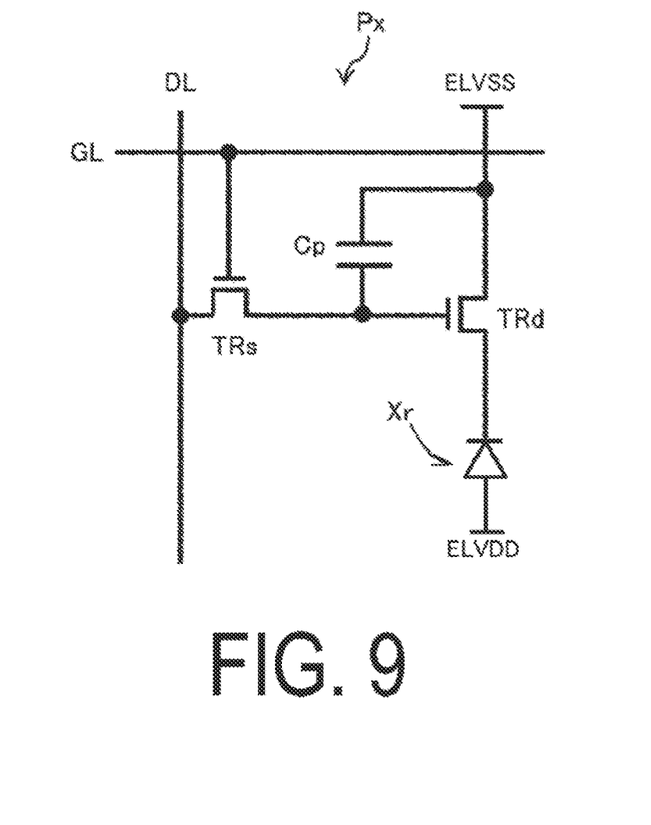
FIG. 9 is a circuit diagram illustrating a configuration example of a pixel according to the second embodiment.

FIG. 9 is a circuit diagram illustrating a configuration example of a pixel according to the second embodiment. The pixel Px includes the transistor TRs (selecting transistor), the transistor TRd (drive transistor), the capacitance forming portion Cp, and the light-emitting element Xr. The gate electrode of the selecting transistor TRs is connected to a scanning signal line GL. The gate electrode of the transistor TRd is connected to the ELVSS power source (low potential-side power source) via the capacitance forming portion Cp, and is connected to the data signal line DL via the transistor TRs. The anode electrode (common electrode 25) of the light-emitting element Xr is connected to the ELVDD power source (high potential-side power source). The cathode electrode (pixel electrode 22) of the light-emitting element Xr is connected to the ELVSS power source via the transistor TRd. In FIG. 8, the first metal layer Ma is connected to the gate electrode GE of the transistor TRd, and the second metal layer Mb is connected to the low potential-side power source (ELVSS power source).

The embodiments described above are for the purpose of illustration and description and are not intended to be limiting. It will be apparent to those skilled in the art that many variations will be possible in accordance with these examples and descriptions.

REFERENCE SIGNS LIST

10 Display device
2 Base material
4 Thin film transistor layer
5 Light-emitting element layer
6 Sealing layer
16 Gate insulating film
18 Inorganic insulating film
20 Interlayer insulating film
22 Pixel electrode
23 Cover film
24e Light-emitting layer
24i Hole injection layer
24n Electron transport layer
24 h Hole transport layer
P1 First portion (of pixel electrode)
P2 Second portion (of pixel electrode)
P3 Third portion (of pixel electrode)
P4 Fourth portion (of pixel electrode)
FS Planar face
CP Capacitance forming portion
SL Data signal line
GL Scanning signal line

The invention claimed is:
1. A display device provided with a display region including a plurality of pixels, the display device comprising:
a base material;

a thin film transistor layer including a thin film transistor; and a light-emitting element layer including a plurality of light-emitting elements with different luminescent colors and formed on an upper layer overlying the thin film transistor, wherein the light-emitting element layer includes a pixel electrode provided for each of the plurality of light-emitting elements, a cover film, a common electrode common to the plurality of light-emitting elements, and a light-emitting layer provided between the pixel electrode and the common electrode, one of the pixel electrode and the common electrode is an anode electrode, and a remaining one of the pixel electrode and the common electrode is a cathode electrode, the pixel electrode includes a flat first portion overlapping with the light-emitting layer and a second portion surrounding the first portion, the first portion protrudes toward the light-emitting layer compared to the second portion, the cover film covers the second portion and exposes the first portion, and an upper face of the first portion and an upper face of the cover film form a flush planar face.

2. The display device according to claim 1, wherein the thin film transistor layer includes a capacitance forming portion, and the capacitance forming portion overlaps with the first portion.

3. The display device according to claim 2, wherein the capacitance forming portion includes a first metal layer, an inorganic insulating film, and a second metal layer facing the first metal layer with the inorganic insulating film interposed between the first metal layer and the second metal layer.

4. The display device according to claim 3, wherein the first metal layer is formed at a same layer as a gate electrode of the thin film transistor and formed of a same material as the gate electrode, and the second metal layer is formed at a same layer as a source electrode of the thin film transistor and formed of a same material as the source electrode.

5. The display device according to claim 1, wherein the thin film transistor does not overlap with the first portion, the pixel electrode includes a third portion provided on an outer side of the second portion in a plan view and overlapping with at least one of a semiconductor film, an electrode, and a wiring line which are included in the thin film transistor layer, to protrude toward the light-emitting layer, and the third portion is covered by the cover film.

6. The display device according to claim 5, wherein the first portion and the third portion are separated from each other by 5 µm or more.

7. The display device according to claim 1, wherein the thin film transistor layer includes the thin film transistor and an interlayer insulating film formed on an upper layer overlying the thin film transistor, and the pixel electrode includes a fourth portion provided on an outer side of the second portion in a plan view and being in contact with a drain electrode or a source electrode of the thin film transistor through a contact hole formed at the interlayer insulating film.

8. The display device according to claim 7, wherein the contact hole is filled with the cover film.

9. The display device according to claim 1, wherein a charge function layer common to the plurality of light-emitting elements is formed on the planar face.

10. The display device according to claim 9, wherein the charge function layer is a charge injection layer.

11. The display device according to claim 10, wherein a charge transport layer is provided between the charge injection layer and the light-emitting layer.

12. The display device according to claim 1, wherein the cover film is formed of an organic resin.

13. The display device according to claim 3, wherein the first metal layer is connected to a gate electrode of the thin film transistor, and the second metal layer is connected to a high potential-side power source.

14. The display device according to claim 3, wherein the first metal layer is connected to a gate electrode of the thin film transistor, and the second metal layer is connected to a low potential-side power source.

15. The display device according to claim 1, further comprising:

a hole injection layer, a hole transport layer, and an electron transport layer, in addition to the light-emitting layer, between the pixel electrodes and the common electrode, wherein at least one of the light-emitting layer, the hole injection layer, the hole transport layer, and the electron transport layer is formed of a coatable material.

16. The display device according to claim 1, wherein the light-emitting layer is a quantum dot light-emitting layer.

17. The display device according to claim 1, wherein the light-emitting layer is an organic light-emitting layer.

18. A method for manufacturing a display device, the display device including:

a base material;

a thin film transistor layer including a thin film transistor; and a light-emitting element layer including a plurality of light-emitting elements with different luminescent colors and formed on an upper layer overlying the thin film transistor, the light-emitting element layer including:

a pixel electrode provided to each of the plurality of light-emitting elements;

a cover film;

a common electrode common to the plurality of light-emitting elements; and a light-emitting layer provided between the pixel electrode and the common electrode, the method comprising:

forming the pixel electrode including a flat first portion and a second portion surrounding the first portion, the first portion protruding toward the light-emitting layer compared to the second portion;

forming the cover film covering the second portion and exposing the first portion; and forming, by using a coating method, the light-emitting layer overlapping with the first portion and the second portion.

19. The method for manufacturing a display device according to claim 18, wherein an upper face of the first portion and an upper face of the cover film form a flush planar face.

20. The method for manufacturing a display device according to claim 19, further comprising:

forming, on the planar face, a charge function layer common to the plurality of light-emitting elements.

* * * * *